(12) United States Patent  
Tertinek

(10) Patent No.: US 10,511,311 B1  
(45) Date of Patent: Dec. 17, 2019

(54) PHASE-CONTINUOUS REFERENCE CLOCK FREQUENCY SHIFT FOR DIGITAL PHASE LOCKED LOOP

(71) Applicant: Intel Corporation, Santa Clara, CA (US)

(72) Inventor: Stefan Tertinek, Linz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/118,708

(22) Filed: Aug. 31, 2018

(51) Int. Cl.

| | | |
|---|---|---|
| *H03L 7/07* | (2006.01) | |
| *G04F 10/00* | (2006.01) | |
| *H03L 7/099* | (2006.01) | |
| *H03L 7/085* | (2006.01) | |
| *H03L 7/081* | (2006.01) | |

(52) U.S. Cl.  
CPC .............. *H03L 7/07* (2013.01); *G04F 10/005* (2013.01); *H03L 7/085* (2013.01); *H03L 7/0814* (2013.01); *H03L 7/0992* (2013.01); *H03L 2207/50* (2013.01)

(58) Field of Classification Search  
CPC . H03L 7/093; H03L 7/091; H03L 7/16; H03L 7/087; H03L 7/10; H03L 7/104; H03L 7/22; H03L 7/24; H03L 7/08  
USPC ........................................ 327/156, 158, 159  
See application file for complete search history.

(56) References Cited

U.S. PATENT DOCUMENTS

| | | | |
|---|---|---|---|
| 6,744,323 B1 | 6/2004 | Moyal et al. | |
| 2006/0119442 A1 | 6/2006 | Azam et al. | |
| 2012/0074995 A1 | 3/2012 | Zhang | |
| 2014/0097875 A1* | 4/2014 | Tertinek | ................ H03L 7/1976 327/105 |

OTHER PUBLICATIONS

International Search Report and Written Opinion dated Oct. 24, 2019 in connection with International Application Number PCT/US2019/042346.

* cited by examiner

*Primary Examiner* — John W Poos  
(74) *Attorney, Agent, or Firm* — Eschweiler & Potashnik, LLC

(57) ABSTRACT

Systems, circuitries, and methods are described for phase-continuous shifting of a reference clock frequency from $f_{REF}$ to $N_{REF}$ for a DPLL that includes a DCO and a feedback loop that generates a feedback signal. The DPLL generates a local oscillator signal based on an analog reference signal having a reference clock frequency $f_{REF}$ and a digital reference signal having the reference clock frequency $f_{REF}$. In one example, the method includes receiving a target time and at expiration of a first nonzero interval after the target time, generating a subsequent feedback signal having the target reference clock frequency $Nf_{REF}$; at expiration of a second nonzero interval after the target time, generating a subsequent analog reference signal having the target reference clock frequency $Nf_{REF}$; and at expiration of a third nonzero interval after the target time, generating a subsequent digital reference clock signal having the target reference clock frequency $Nf_{REF}$.

25 Claims, 6 Drawing Sheets

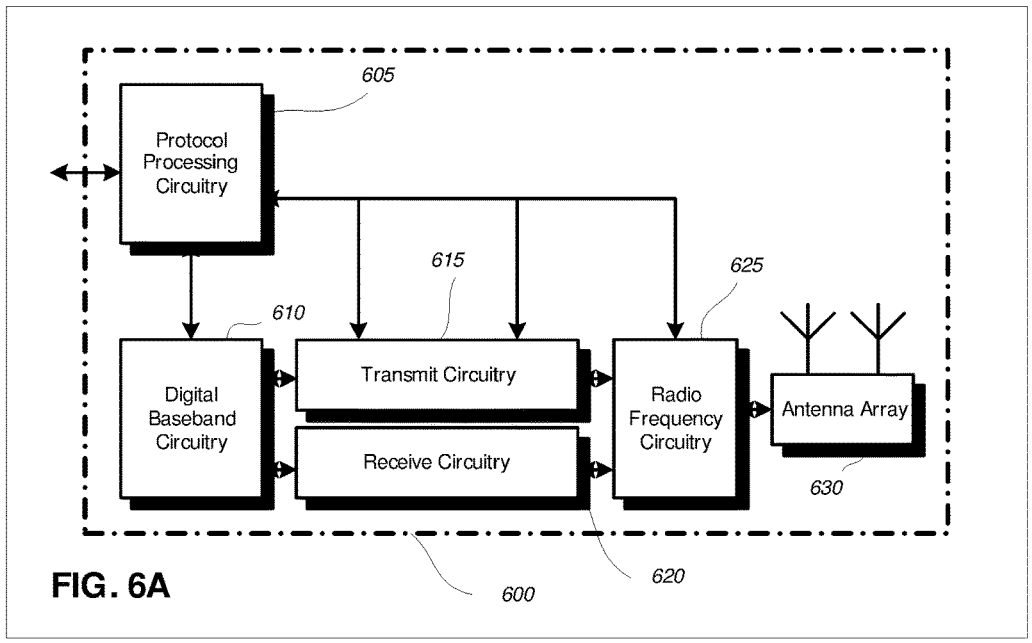
FIG. 6A
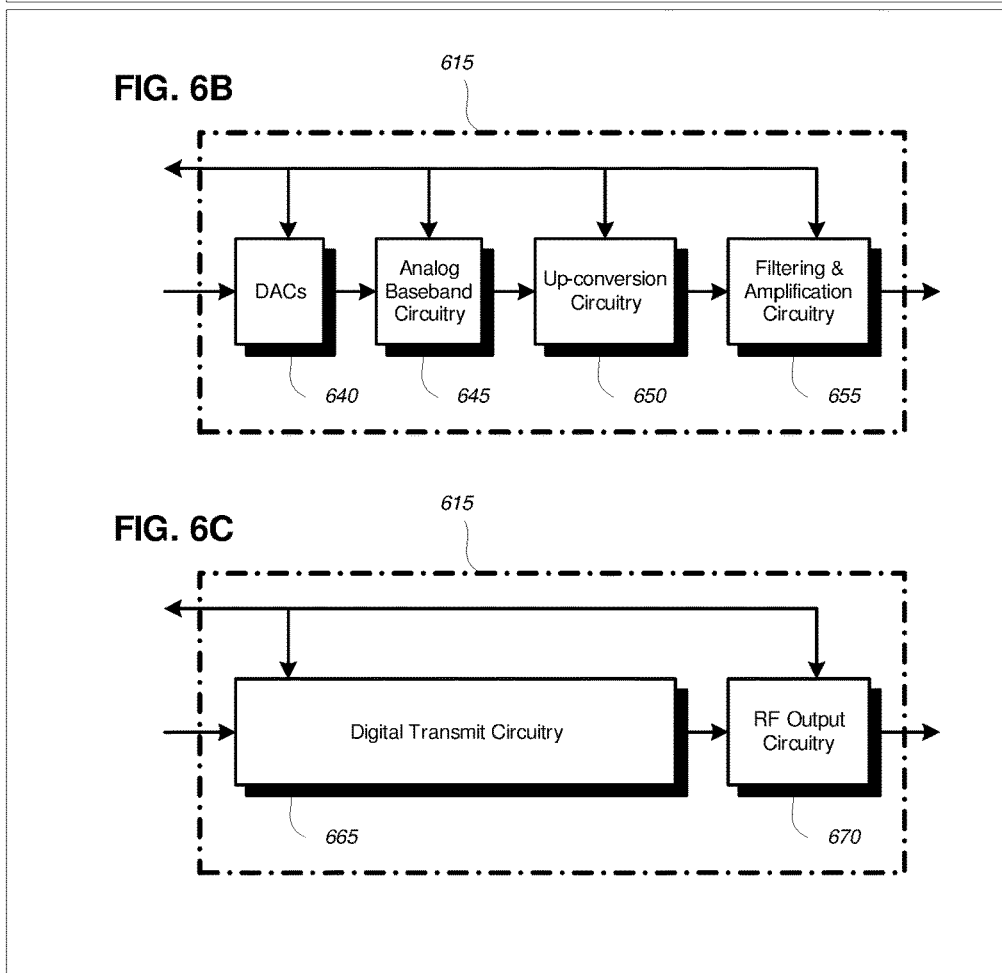
FIG. 6B
FIG. 6C

PHASE-CONTINUOUS REFERENCE CLOCK FREQUENCY SHIFT FOR DIGITAL PHASE LOCKED LOOP

BACKGROUND

Next-generation integrated RF transceivers are required to support up to 1024-QAM in the down-link. To meet the stringent error vector magnitude (EVM) requirements for such high modulation orders, the digital phase locked loop (DPLL) generating the local oscillator (LO) signal has to have very low integrated phase noise. The phase noise can be significantly improved by running the DPLL at a high reference clock frequency. This reduces the time-to-digital converter (TDC) noise caused by quantization, nonlinearity (DNL/INL) and analog delay jitter.

BRIEF DESCRIPTION OF THE DRAWINGS

FIGS. 6A-6C illustrate examples for an exemplary communication circuitry in accordance with various aspects described.

DESCRIPTION

While running the DPLL at a high reference clock frequency ($F_{REF}$) can significantly reduce phase noise, the use of high $F_{REF}$ comes at the cost of increased power consumption. Further, in many transceiver operating scenarios the benefit of a higher $F_{REF}$ does not justify the increased power consumption. Unfortunately in current DPLL-based LO generation systems $F_{REF}$ can only be switched to a different frequency through a complete power-down/power-up cycle. Each power-down/power-up cycle may require up to 100-200 µsec which is much longer than a data symbol. Therefore, to take advantage of the reduced phase noise desired in certain operating conditions, the choice has been to either restart the DPLL when a higher $F_{REF}$ is justified which significantly impacts performance or continuously operate at the higher $F_{REF}$ which significantly increases power consumption.

Described herein are LO signal networks, circuitries, and methods that switch $F_{REF}$ during normal transceiver operation while maintaining LO phase continuity. As will become clear in the description below, the disclosed "dynamic" switching of $F_{REF}$ during normal operation is to be contrasted with switching the $F_{REF}$ by performing a DPLL power-down/power-up cycle. The disclosed LO signal networks, circuitries, and methods dynamically switch $F_{REF}$ while the DPLL continues to generate an LO signal. In other words, dynamic switching of $F_{REF}$ involves switching that occurs seamlessly while the DPLL is operating at a first $F_{REF}$. The switching of $F_{REF}$ is based on a trigger signal which is derived from transceiver performance and/or operation conditions. The trigger signal specifies a target time at which to switch to the new $F_{REF}$ and, optionally, the frequency of the new $F_{REF}$.

Figure 1A:
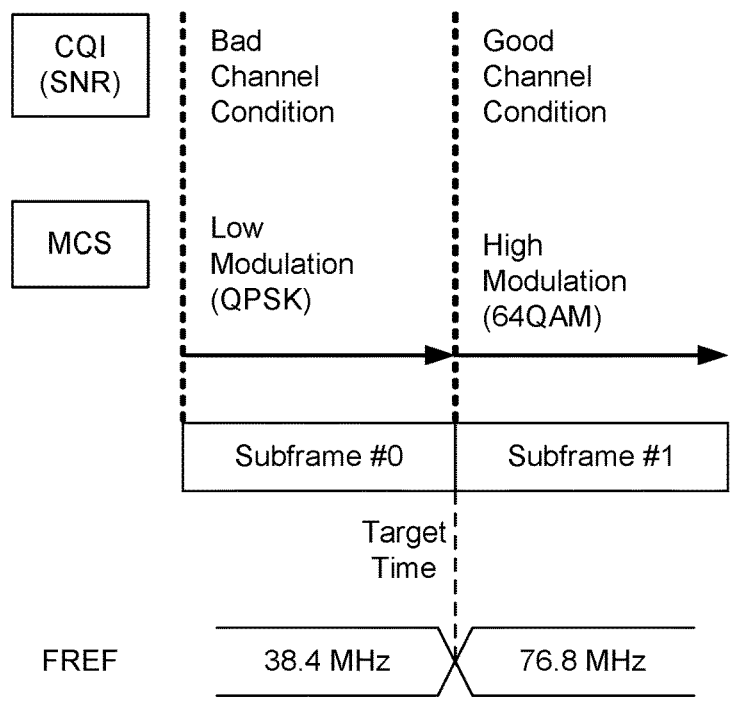
FIGS. 1A-1C illustrate exemplary transceiver use cases in which dynamically changing the reference clock frequency is beneficial.

FIG. 1A illustrates a use case in which $F_{REF}$ is increased in response to improvements in channel condition. When the base station signals to the transceiver (e.g., user equipment (UE)) that the channel condition is improving (e.g., by the channel quality indicator (CaI)), then the transceiver may increase its uplink data throughput by switching to a higher modulation and coding scheme (MCS). For example, the transceiver may change the modulation from quadrature phase shift keying (QPSK) to 64 quadrature amplitude modulation (64 QAM). To improve uplink throughput performance (e.g., EVM), the DPLL phase noise can be reduced by switching to a higher $F_{REF}$ during transceiver operation under the higher modulation and coding scheme. Note that the change in $F_{REF}$ is made in between subframes without turning the DPLL off/on. In this use case, the target time for switching to the higher $F_{REF}$ specified in the triggers signal is aligned with an MCS change at the sub-frame border as shown in FIG. 1A.

For the purposes of this description the DPLL is described as operating at first reference clock frequency $F_{REF}$ and then being dynamically switched to operate at a second reference clock frequency, sometimes referred to herein as $NF_{REF}$. In the described examples the first reference clock frequency $F_{REF}$ is 38.4 MHz and the second reference clock frequency $NF_{REF}$ is 76.8 MHz. Thus, in the described examples, N=2 and the reference clock frequency shifting system shifts between $F_{REF}$ and $2F_{REF}$. Of course the new $F_{REF}$ may be higher or lower than the "normal" or present $F_{REF}$ by any factor or amount. In other examples, switching between more than two $F_{REF}$ may be supported. When only two $F_{REF}$ are used, the trigger signal may only specify a target time at which to switch frequencies as the target $F_{REF}$ would already be known.

Figure 1B:
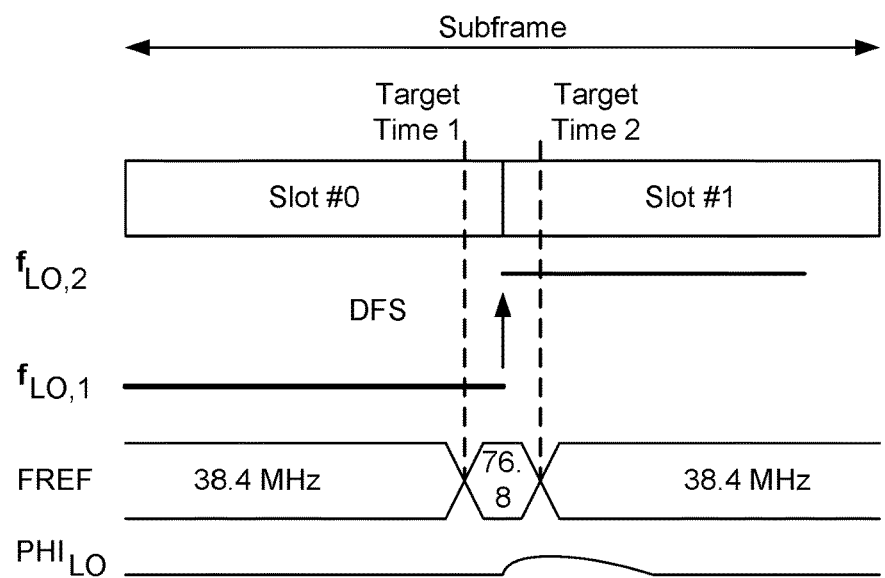

FIG. 1B illustrates an operating scenario in which $F_{REF}$ is changed to a higher frequency during a digital frequency shift (DFS). A DFS is a feature for digital IQ transmitters in which the LO (DPLL) is shifted to the center of a low resource-block (RB) allocation, while simultaneously the RB is shifted to zero in the digital front end (DFE). DFS produces the same transmit (TX) output signal as without the shift, but with reduced spurious emissions. If the LO and RB shifts are not time aligned, a frequency error will result at the DPLL, causing LO phase transient and symbol EVM degradation. Switching to a higher $F_{REF}$ during DFS allows the DPLL to have a faster loop response and settle the phase much faster as shown in the trace at the bottom of FIG. 1B.

System information from the TX DFE indicating that the RB allocation will be lowered and that spurious emissions may increase may be used to trigger the shift in $F_{REF}$. In the DFS $F_{REF}$ shift scenario there are two target times, a first target time at which $F_{REF}$ is increased (e.g., to 76.8 MHz in FIG. 1B) and a second target time at which $F_{REF}$ is returned to the "normal operating" frequency (e.g., 38.4 MHz in FIG. 1B). The first target time occurs just before an end of a last slot before DFS is to occur and the second target time occurs just after a beginning of the immediately subsequent slot. The time between the first target time and the second target time may be a fixed amount of time or may vary depending on the degree of change in frequency brought about by the DFS.

Figure 1C:
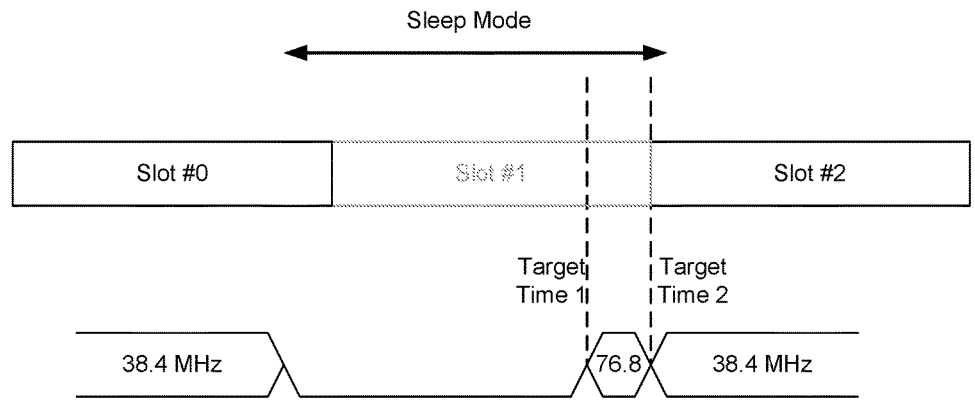

FIG. 1C illustrates a third transceiver operating scenario in which the TX chain or RX chain is put into sleep mode to save power. In sleep mode, the DPLL is also asleep. The time to wake up the DPLL from sleep mode can be reduced by dynamically and temporarily shifting $F_{REF}$ to a higher frequency to settle the initial frequency error much faster and then switching back to the lower $F_{REF}$ to save power. In the waking up scenario there are two target times, a first target time at which $F_{REF}$ is increased (e.g., to 76.8 MHz in FIG. 1B) and a second target time at which $F_{REF}$ is returned to the "normal operating" frequency (e.g., 38.4 MHz in FIG. 1B). The first target time occurs just before an end of a last slot in which the DPLL is asleep and the second target time occurs at the beginning of the immediately subsequent slot. The time between the first target time and the second target time may be a fixed amount of time or more vary depending on factors such as a change in temperature during sleep. A power management system may provide a control signal to wake the TX chain or RX chain from sleep and this control signal may in turn be used to trigger the temporary change in $F_{REF}$.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 2:
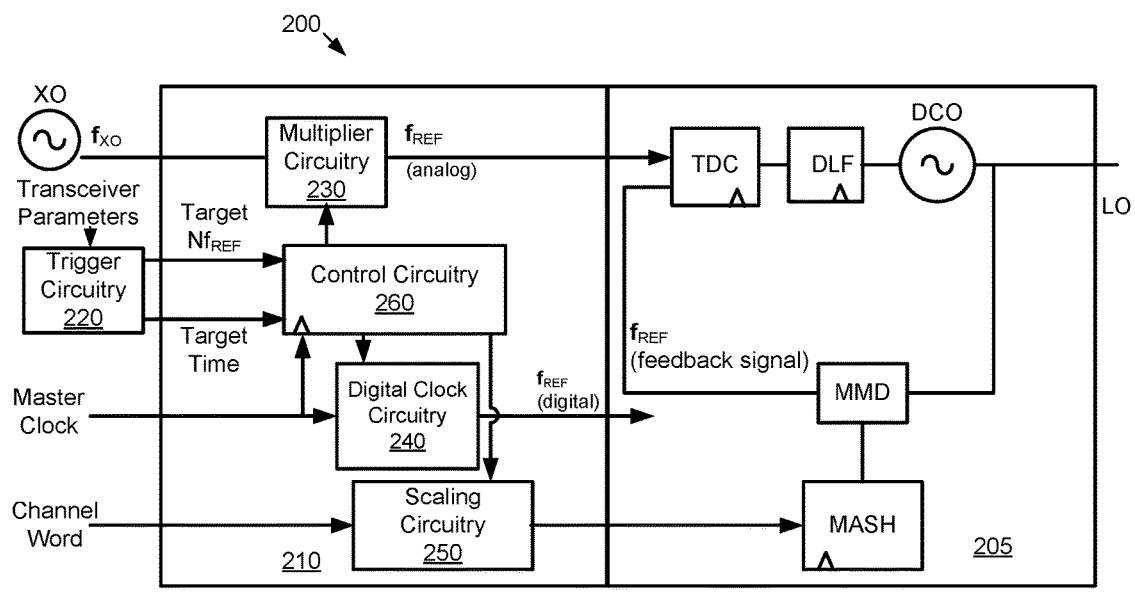
FIG. 2 illustrates an exemplary LO signal generation system that includes reference clock switching circuitry in accordance with various aspects described.

FIG. 2 illustrates an exemplary local oscillator signal generation system 200 that includes a digital phase locked loop (DPLL) 205, reference clock frequency shifting circuitry 210, and trigger circuitry 220. The DPLL includes a time-to-digital converter (TDC) that compares the phase of an analog reference clock signal having the reference clock frequency $f_{REF}$ with a feedback signal from a digitally controlled oscillator (DCO) that generates the local oscillator signal. The TDC outputs a control signal for the DCO that adjusts the DCO in a manner that reduces the difference between the phase of the feedback signal and the analog reference clock signal. A digital loop filter (DLF) filters the output of the TDC to smooth the adjustments made to the DCO.

Because the frequency of the LO signal output by the DCO is often a fractional multiple of the frequency of the analog reference clock signal, the feedback loop includes a multi modulus divider (MMD) that divides the frequency of the signal output by the DCO by a varying divisor such that the average frequency of the feedback signal matches the frequency of the analog reference clock signal. The varying divisor used by the MMD is generated by a multi-stage noise shaper (MASH) which receives a digital channel word at its input. The MASH generates a varying divisor such that its average equals the channel word. The various digital components of the DPLL 205 are clocked by a digital reference clock signal having the frequency $f_{REF}$.

The reference clock frequency shifting circuitry 210 enables phase-continuous shifting of the $f_{REF}$ during DPLL operation, without requiring a power-down/power-up cycle of the DPLL. The reference clock frequency shifting circuitry 210 includes multiplier circuitry 230, digital clock circuitry 240, scaling circuitry 250, and control circuitry 260. The multiplier circuitry receives an analog oscillator signal (e.g., from a crystal oscillator) having a frequency $f_{XO}$ and is capable of multiplying (or dividing) the frequency of the oscillator signal by a factor f to generate the analog reference clock signal having the desired reference clock frequency $f_{REF}$. The digital clock circuitry generates the digital reference clock signal having the desired reference clock frequency $f_{REF}$ from a master digital clock signal. The scaling circuitry 250 scales or adjusts the channel word that controls the divisor used by the MMD.

The control circuitry 260 receives a target reference clock frequency, referred to herein as $Nf_{REF}$, and a target time at which to switch to the target reference clock frequency from the trigger circuitry 220. In some examples, switching is performed between only two reference frequencies and in this case the trigger circuitry 220 may only communicate a target time to the control circuitry 260 and the control circuitry may simply identify the target reference clock frequency as the reference clock frequency not currently in use (e.g., 38.4 MHz if reference clock frequency is currently 76.8 MH or vice versa). The trigger circuitry 220 receives signals indicative of various transceiver operating parameters and determines a target time at which a shift in $f_{REF}$ would be beneficial. For example, the trigger circuitry 220 may receive a signal from the TX DFE that a DFS will be performed after a given slot and in response generate a target time that coincides with the timing of the slot to switch to an increased reference clock frequency $Nf_{REF}$ as outlined in FIG. 1B. Throughout this description it is to be understood that the target time occurs after the last power-up of the DPLL and does not coincide with the start time of the DPLL.

In response to receiving the target time from the trigger circuitry 220, the control circuitry controls operation of the multiplier circuitry 230, the digital clock circuitry 240, and the scaling circuitry 250 such that the reference clock frequency is changed to the target reference clock frequency and the LO signal output by the DPLL remains phase-continuous (i.e., without causing phase transients or an absolute phase shift). Because the shift in reference clock frequency occurs during regular transceiver operation, the control circuitry 260 issues control signals to the multiplier circuitry 230, the digital clock circuitry 240, and the scaling circuitry 250 at specific (often different) times (or at the expiration of different nonzero time intervals after the target time) so that the generation of the new analog reference clock signal, the new digital reference clock signal, and the new feedback signal are coordinated and do not produce transients or a phase shift.

Figure 3:
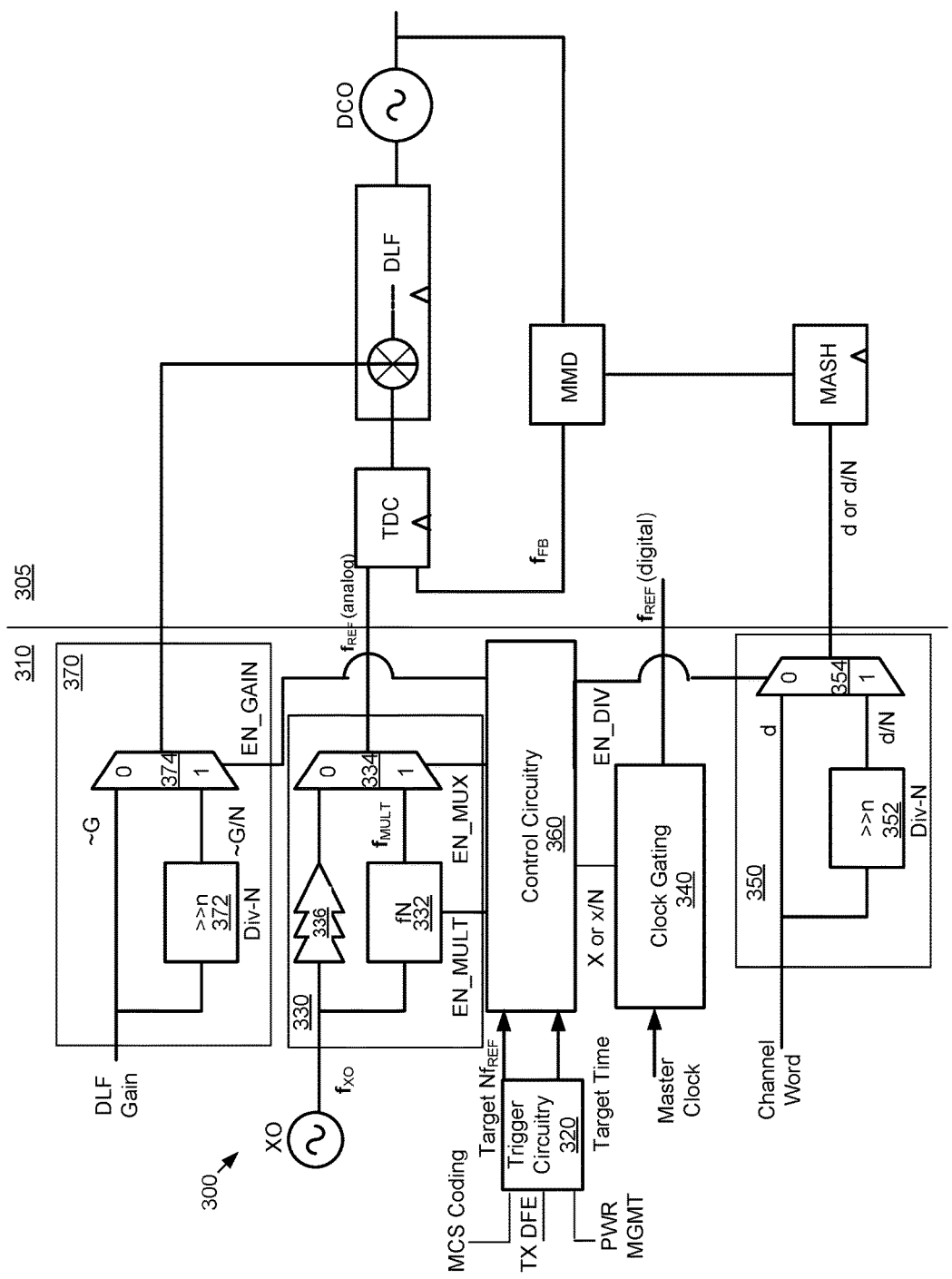
FIG. 3 illustrates another exemplary LO signal generation system that includes reference clock switching circuitry in accordance with various aspects described.

FIG. 3 illustrates an exemplary LO signal generation system 300 that includes a DPLL 305, reference clock frequency shifting circuitry 310, and trigger circuitry 320. The DPLL 305 functions in the same manner as described for the DPLL of FIG. 2. The trigger circuitry 320 receives signals from various transceiver components and systems, such as an MCS coding selection system, a TX DFE, and a power management system. Examples of use cases in which information from these systems can be used to determine that it is beneficial to increase $f_{REF}$ to $Nf_{REF}$ were illustrated in FIGS. 1A-1C. For the purposes of the following description N is 2, however, N may be any positive number, including a fraction (meaning that $Nf_{REF}$ is lower than $f_{REF}$).

In response to signals from these transceiver components and systems, the trigger circuitry 320 generates a target time at which to switch $f_{REF}$ and communicates the target time to control circuitry 360. For example when the trigger circuitry 320 receives signals indicating that the transceiver has been requested to improve its data throughput in a New Radio Uplink, the trigger circuitry generates a target time corresponding with timing of a sub-frame border. If the $f_{REF}$ can be switched between more than two operating frequencies, then the trigger circuitry 320 may also select a target $f_{REF}$ based on the signals from the transceiver components and systems. The trigger circuitry 320 may be implemented with a programmable processor (e.g., the baseband processor), dedicated hardware components, or any other suitable components.

The reference clock frequency shifting circuitry 310 includes multiplier circuitry 330, clock gating circuitry 340, scaling circuitry 350, and gain circuitry 370. The multiplier circuitry 330 is connected between a crystal oscillator the input of the TDC. The multiplier circuitry 330 includes a multiplexor 334 and two oscillator signal paths between the crystal oscillator and the multiplexor 334. The first or top path in FIG. 3 passes the crystal oscillator signal, without multiplication, to the multiplexor 334. A crystal oscillator may be chosen that generates a standard or default reference clock frequency $f_{REF}$ such that the signal input to the multiplexor 334 on the first path already has the desired $f_{REF}$. In other examples, the first path includes a multiplier or divider that acts on the crystal oscillator signal to generate the analog reference clock signal having the reference clock frequency $f_{REF}$. The bottom or second path includes a multiplication circuitry 332 that multiplies the crystal oscillator signal frequency to generate the analog reference clock signal (e.g., multiplied oscillator signal) having the other reference clock frequency $Nf_{REF}$, to which the reference clock frequency is switched. In one example, the multiplication circuitry 332 includes XOR circuitry that performs a logical XO operation on the crystal oscillator signal with a delayed version of the crystal oscillator signal. In the illustrated example, the first path also includes plurality of buffers configured to delay the oscillator signal in an equivalent manner as compared to delay of the oscillator signal caused by the multiplication circuitry 332. Note that the multiplier circuitry 330 may also be capable of dividing the frequency of the crystal oscillator signal, depending on the relationship between the crystal oscillator's frequency and the desired analog reference clock frequency.

To control the multiplier circuitry 330, the control circuitry 360 generates an enable signal for the multiplication circuitry 332 (EN_MULT). Once the output of the multiplication circuitry 332 is stable, the control circuitry 360 generates a selection signal for the multiplexor 334 (EN_MUX) that causes the multiplexor 334 to select the signal from the second path as the analog reference clock signal. In one example, there is a predetermined interval between the EN_MULT signal and the EN_MUX signal. It can be seen that when the control circuitry 360 controls the multiplexor 334 to select the input from the first path, $f_{REF}$ is the reference clock frequency and when control circuitry 360 controls the multiplexor 334 to select the input from the second path, $Nf_{REF}$ is the reference clock frequency.

The clock gating circuitry 340 is a particular example of the digital clock circuitry 240 of FIG. 2. The clock gating circuitry 340 receives a master clock signal and generates the digital reference clock signal by gating the pulses of the master clock. For example to generate a digital clock signal having the frequency $f_{REF}$ the clock gating circuitry 340 passes every xth pulse of the master clock signal. The value for x is chosen based on the frequency $f_{REF}$. To generate a digital reference clock signal having the frequency $f_{REF}$, the control circuitry 360 controls the clock gating circuitry to pass every x/Nth pulse of the master clock signal. For example if the clock gating circuitry 340 passes every $4^{th}$ pulse of the master clock signal to generate a digital reference clock signal having a frequency of 38.4 MHz, then to generate a digital reference clock signal having a frequency of 76.8 MHz, the clock gating circuitry will be controlled to pass every $2^{nd}$(x/Nth) master clock signal pulse.

The scaling circuitry 350 includes a multiplexor 354 and two paths for the channel word to reach the multiplexor 354. The first or top channel word path in FIG. 3 passes an input channel word to the multiplexor 334. The bottom or second path includes a divider circuitry 352 that divides the channel word by N to generate a scaled channel word. The scaled channel word specifies a divisor d used by the MMD to divide the frequency of the LO signal so that the frequency of the feedback signal is $Nf_{REF}$. In one example, the divider circuitry 352 includes shifting circuitry that shifts the channel word by a number of places to accomplish the desired division. Note that the divider circuitry 352 may also be capable of multiplying the channel word, depending on the relationship between $f_{REF}$ and $Nf_{REF}$.

To control the scaling circuitry 350, the control circuitry 360 generates an enable signal for the multiplexor 354 (EN_DIV) which causes the multiplexor to select the second path and output the divided divisor d/N. Thus, when control circuitry 360 controls the multiplexor 354 to select the input from the first path, the divisor is d and when control circuitry 360 controls the multiplexor 334 to select the input from the second path, d/N is the divisor. By way of example, if the MMD divisor is 100 when the reference clock frequency is 38.4 MHz, then the MMD divisor should be 50 when the reference clock frequency is 76.8 MHz.

The digital loop filter gain G compensates the gains around the loop (e.g., from the TDC input to the MMD output) so as to have a deterministic loop gain independent of the configuration or analog parameters such as the process-dependent DCO gain. The gain of the MMD will be 1/d when the divisor is d. The loop gain G should be changed proportionally to the change in d. Thus when the divisor changes to d/N, the MMD gain changes from 1/d to 1/(d/N) or N/d. To compensate, the gain should then be changed from G to G/N. To this end, gain circuitry 370 changes the gain G between G and G/N. The gain circuitry 370 includes a multiplexor 374 and two paths for the digital loop filter gain G to reach the multiplexor 374. The first or top path in FIG. 3 passes digital loop filter gain G to the multiplexor 374. The bottom or second path includes a divider circuitry 372 that divides the gain set by the transceiver by N to generate the adjusted gain G/N.

To control the gain circuitry 370, the control circuitry 360 generates an enable signal for the multiplexor circuitry 374 (EN_GAIN) which causes the multiplexor to select the second path and output the adjusted gain G/N. Thus, when control circuitry 360 controls the multiplexor 374 to select the input from the first path, the digital loop filter gain is G and when control circuitry 360 controls the multiplexor 374 to select the input from the second path, G/N is the digital loop filter gain.

Figure 4:
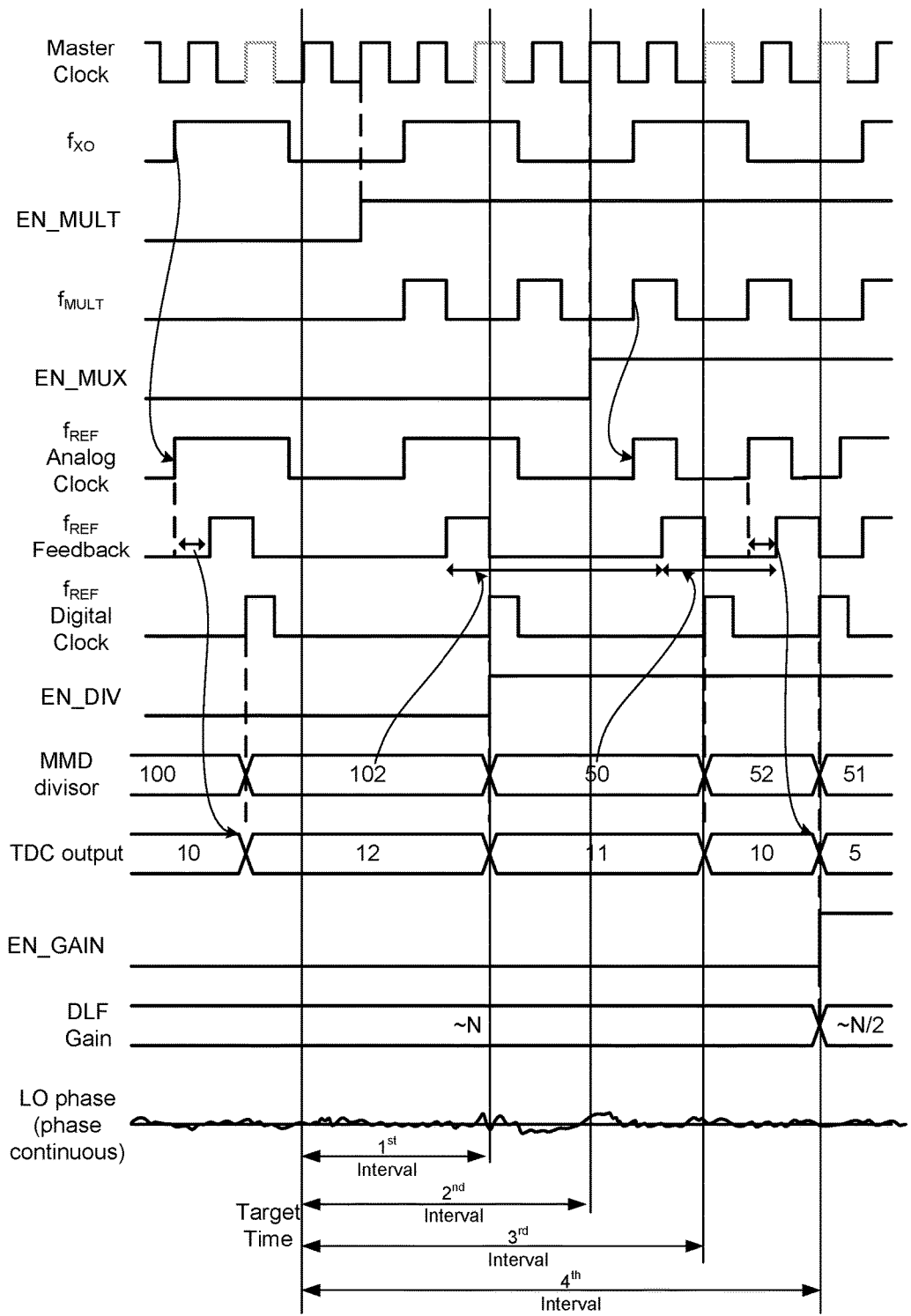
FIG. 4 illustrates a timing diagram for various control signals generated by control circuitry of the reference clock switching circuitry in accordance with various aspects described.

FIG. 4 is a timing diagram of an example sequence of control signals generated by control circuitry (see circuitry shown in FIG. 3) to transition from $f_{REF}$ to $Nf_{REF}$ where N is 2. The first trace shows the master clock signal and the second trace shows the crystal oscillator signal. It can be seen that when the reference clock frequency is $f_{REF}$ the analog reference clock signal coincides with the crystal oscillator frequency. The digital reference clock signal corresponds to every fourth pulse of the master clock signal. The phase of the feedback signal is lagging the analog reference clock signal, causing the TDC to output an increased control word (12 as compared to 10) for the DCO.

The target time is received from the trigger circuitry 320 and in response the control circuitry 360 first generates the EN_MULT signal to cause the multiplication circuitry 332 to begin multiplying the frequency of the crystal oscillator signal by 2. At the expiration of a first nonzero interval of time after the target time, the control circuitry 360 generates the EN_DIV signal to cause the adjusted divisor d/2 (resulting from the scaling of the channel word) to be used by the MMD. It can be seen that the MMD divisor changes from 102 to 50 in response to the EN_DIV signal. At the expiration of a second nonzero interval of time after the target time the control circuitry generates the EN_MUX control signal to cause the multiplexor 334 to pass the multiplied crystal oscillator signal which has the frequency $2f_{REF}$. Recall that the interval of time between the EN_MULT signal and the EN_MUX signal is to allow the multiplied signal to settle before the multiplied signal is used as the analog reference clock signal. It can be seen that the analog reference clock frequency switches to $2f_{REF}$ as a result of the EN_MUX signal.

At the expiration of a third nonzero interval of time after the target time the control circuitry controls the clock gating circuitry 340 to begin passing every $2^{nd}$ master clock pulse as the digital reference clock signal. Because the change of the divisor is time-aligned with the doubling of the analog reference clock frequency, the TDC will see no change in phase and the LO phase will remain phase-continuous.

At the expiration of a fourth nonzero interval of time after the target time the control circuitry generates the EN_GAIN control signal, which causes the gain of the digital loop filter to be adjusted to a value of G/2. The fourth nonzero interval of time is selected to coincide with the clock cycle right before the code corresponding to the new reference clock frequency arrives at the gain input to ensure that the code corresponding to the new reference clock frequency is multiplied by the corresponding scaled digital loop filter gain G/2. While a particular sequence of control signals is illustrated in FIG. 4, any other sequence may be used to control the multiplier circuitry 330, clock gating circuitry 340, scaling circuitry 350, and gain circuitry 370 such that the reference clock frequency is changed while the LO signal remains phase continuous.

Figure 5:
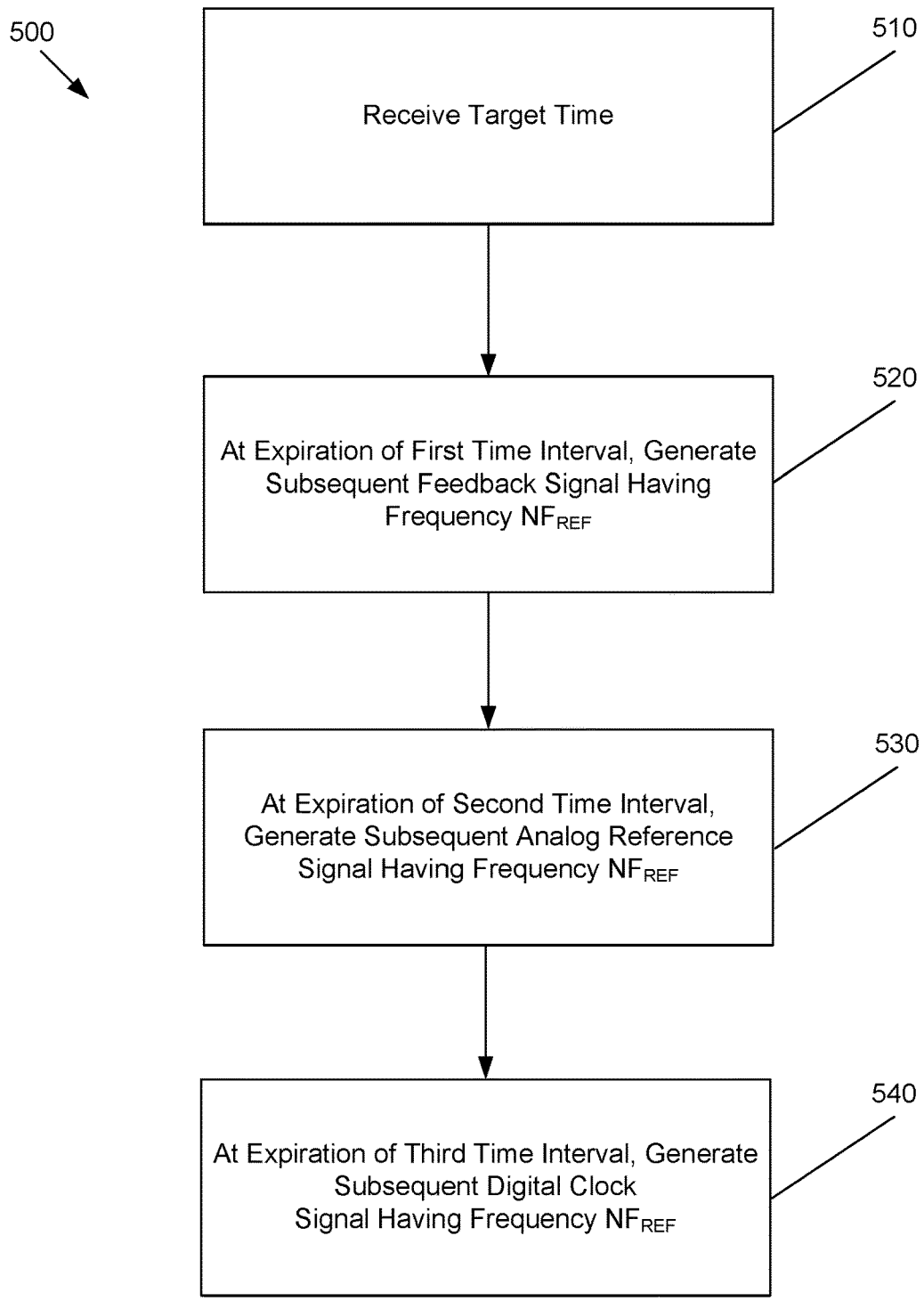
FIG. 5 illustrates an exemplary flow diagram of an exemplary method of dynamically switching reference clock frequency in accordance with various aspects described.

FIG. 5 illustrates a flow diagram outlining an exemplary method 500 for shifting a reference clock frequency from $f_{REF}$ to $Nf_{REF}$ for a digital phase locked loop (DPLL) that includes a digitally controlled oscillator (DCO) and a feedback loop that generates a feedback signal. The DPLL generates a local oscillator signal based on an analog reference signal having a reference clock frequency $f_{REF}$ and a digital reference signal having the reference clock frequency $f_{REF}$. The method 500 may be performed by the control circuitry 260, 360 of FIGS. 2 and 3, respectively. The method includes, at 510, receiving a target time. At 520 the method includes generating a subsequent feedback signal having the target reference clock frequency $Nf_{REF}$ at expiration of a first nonzero interval after the target time. At 530 the method includes generating a subsequent analog reference signal having the target reference clock frequency $Nf_{REF}$ at expiration of a second nonzero interval of time after the target time. At 540 the method includes generating a subsequent digital reference clock signal having the target reference clock frequency $Nf_{REF}$ at expiration of a third nonzero interval after the target time.

FIG. 6A illustrates an exemplary millimeter wave communication circuitry 600 which may embody transceivers that include LO signal generation system that supports dynamic reference clock frequency shifting according to some aspects. Circuitry 600 is alternatively grouped according to functions. Components as shown in 600 are shown here for illustrative purposes and may include other components not shown here in FIG. 6A.

Millimeter wave communication circuitry 600 may include protocol processing circuitry 605, which may implement one or more of medium access control (MAC), radio link control (RLC), packet data convergence protocol (PDCP), radio resource control (RRC) and non-access stratum (NAS) functions. Protocol processing circuitry 605 may include one or more processing cores (not shown) to execute instructions and one or more memory structures (not shown) to store program and data information.

Millimeter wave communication circuitry 600 may further include digital baseband circuitry 610, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 600 may further include transmit circuitry 615, receive circuitry 620 and/or antenna array circuitry 630.

Millimeter wave communication circuitry 600 may further include radio frequency (RF) circuitry 625. In an aspect of the invention, RF circuitry 625 may include multiple parallel RF chains for one or more of transmit or receive functions, each connected to one or more antennas of the antenna array 630.

In an aspect of the disclosure, protocol processing circuitry 605 may include one or more instances of control circuitry (not shown) to provide control functions for one or more of digital baseband circuitry 610, transmit circuitry 615, receive circuitry 620, and/or radio frequency circuitry 625.

FIGS. 6B and 6C illustrate examples for transmit circuitry 615 in FIG. 6A in some aspects.

The exemplary transmit circuitry 615 of FIG. 6B may include one or more of digital to analog converters (DACs) 640, analog baseband circuitry 645, up-conversion circuitry 650 and filtering and amplification circuitry 655. In another aspect, 6C illustrates an exemplary transmit circuitry 615 which includes digital transmit circuitry 665 and output circuitry 670.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for shifting the frequency of a reference clock according to embodiments and examples described herein.

Example 1 is a reference clock frequency shifting circuitry for a digital phase locked loop (DPLL) including a digitally controlled oscillator (DCO) and a feedback loop, wherein the DPLL generates a local oscillator signal based on an analog reference signal having a reference clock frequency $f_{REF}$. The circuitry includes a multiplier circuitry configured to generate the analog reference signal having the reference clock frequency $f_{REF}$; a digital clock circuitry configured to generate a digital reference clock signal having the reference clock frequency $f_{REF}$; a scaling circuitry configured to control the feedback loop to generate a feedback signal having the reference clock frequency $f_{REF}$; and control circuitry. The control circuitry is configured to identify a target reference clock frequency $Nf_{REF}$, where N is a positive number, and receive a target time, and in response: at expiration of a first nonzero interval after the target time, control the scaling circuitry to control the feedback loop to generate a subsequent feedback signal having the target reference clock frequency $Nf_{REF}$; at expiration of a second nonzero interval after the target time, control the multiplier circuitry to generate a subsequent analog reference signal having the target reference clock frequency $Nf_{REF}$; and at expiration of a third nonzero interval after the target time, control the digital clock circuitry to generate a subsequent digital reference clock signal having the target reference clock frequency $Nf_{REF}$.

Example 2 includes the subject matter of example 1, including or omitting optional elements, wherein the scaling circuitry is configured to scale a channel word that controls a divider circuitry in the feedback loop to divide a signal output by the DCO by a divisor d to generate the feedback signal and the control circuitry is configured to control the scaling circuitry to scale the channel word in a manner that causes the divider circuitry to divide the signal output by the DCO by d/N at the expiration of the first nonzero interval.

Example 2 includes the subject matter of example 2, including or omitting optional elements, wherein the scaling circuitry includes a multiplexor; a first channel word path connected to a first input of the multiplexor; and a second channel word path connected to a second input of the multiplexor, wherein the second channel word path includes a divider that divides an input channel word by N to generate a scaled channel word. The control circuitry is configured to control the multiplexor to output the scaled channel word at the expiration of the first nonzero interval.

Example 4 includes the subject matter of example 1, including or omitting optional elements, wherein the multiplier circuitry is configured to receive an oscillator signal having an oscillator frequency and generate the analog reference signal based on the oscillator signal and the control circuitry is configured to control the multiplier circuitry to multiply the oscillator frequency by N at the expiration of the second nonzero interval.

Example 5 includes the subject matter of example 4, including or omitting optional elements, wherein the multiplier circuitry includes a multiplexor; a first oscillator signal path connected to a first input of the multiplexor; and a second oscillator signal path connected to a second input of the, wherein the second oscillator signal path includes a multiplication circuitry that multiplies the oscillator frequency by N to generate a multiplied oscillator signal. The control circuitry is configured to at the expiration of the second nonzero interval, enable the multiplication circuitry; and after a predetermined interval after the expiration of the second nonzero interval, control the multiplexor to output the multiplied oscillator signal.

Example 6 includes the subject matter of example 5, including or omitting optional elements, wherein the first oscillator signal path includes a plurality of buffers configured to delay the oscillator signal in an equivalent manner as compared to delay of the oscillator signal caused by the multiplication circuitry.

Example 7 includes the subject matter of example 1, including or omitting optional elements, wherein the digital clock circuitry includes a clock gating circuitry configured to receive a master clock signal and generate the digital reference signal having a reference clock frequency $f_{REF}$ by passing every $x^{th}$ pulse of the master clock signal and the control circuitry is configured to control the clock gating circuitry to generate the digital reference clock signal by passing every $x/N^{th}$ pulse of the master clock signal at the expiration of the third nonzero interval.

Example 8 includes the subject matter of example 1, including or omitting optional elements, wherein the control circuitry is configured to receive a second target time occurring subsequent to the target time and, in response, at expiration of the first nonzero interval after the second target time, control the scaling circuitry to control the feedback loop to generate a subsequent feedback signal having the reference clock frequency $f_{REF}$; at expiration of the second nonzero interval after the second target time, control the multiplier circuitry to generate a subsequent analog reference signal having the reference clock frequency $f_{REF}$; and at expiration of the third nonzero interval after the second target time, control the digital clock circuitry to generate a subsequent digital reference clock signal having the reference clock frequency $f_{REF}$.

Example 9 includes the subject matter of example 1, including or omitting optional elements, wherein the DPLL includes a digital loop filter that has a gain of G, the reference clock frequency shifting circuitry including: gain circuitry configured to control the gain of the digital loop filter, and wherein the control circuitry is configured to control the gain circuitry to adjust the gain of the digital loop filter to have a gain of G/N at the expiration of a fourth nonzero interval after the target time.

Example 10 includes the subject matter of example 1, including or omitting optional elements, further including trigger circuitry configured to determine the target time based on an operating condition of a transceiver that includes the DPLL.

Example 11 includes the subject matter of example 10, including or omitting optional elements, wherein the trigger circuitry is configured to determine the target time as a time at which a modulation coding scheme is changed.

Example 12 includes the subject matter of example 10, including or omitting optional elements, wherein the trigger circuitry is configured to determine the target time as a time at which a digital frequency shift occurs.

Example 13 includes the subject matter of example 10, including or omitting optional elements, wherein the trigger circuitry is configured to determine the target time as a time at which a transmit chain or receive chain in the transceiver that uses the local oscillator signal wakes from sleep mode.

Example 14 includes the subject matter of example 10, including or omitting optional elements, wherein the trigger circuitry is configured to determine a second target time based on the operating condition and provide the second target time and a second target reference clock frequency to the control circuitry.

Example 15 is a method for shifting a reference clock frequency from $f_{REF}$ to a target reference clock frequency $Nf_{REF}$ for a digital phase locked loop (DPLL) including a digitally controlled oscillator (DCO) and a feedback loop that generates a feedback signal, wherein the DPLL generates a local oscillator signal based on an analog reference signal having a reference clock frequency $f_{REF}$ and a digital reference signal having the reference clock frequency $f_{REF}$. The method includes receiving a target time; at expiration of a first nonzero interval after the target time, generating a subsequent feedback signal having the target reference clock frequency $Nf_{REF}$; at expiration of a second nonzero interval after the target time, generating a subsequent analog reference signal having the target reference clock frequency $Nf_{REF}$; and at expiration of a third nonzero interval after the target time, generating a subsequent digital reference clock signal having the target reference clock frequency $Nf_{REF}$.

Example 16 includes the subject matter of example 15, including or omitting optional elements, wherein the feedback signal is generated by a divider circuitry in the feedback loop, wherein the divider circuitry divides a signal output by the DCO by a divisor d as controlled by a channel word received by the divider circuitry and generating the subsequent feedback signal includes scaling the channel word in a manner that causes the divider circuitry to divide the signal output by the DCO by d/N at the expiration of the first nonzero interval.

Example 17 includes the subject matter of example 15, including or omitting optional elements, wherein generating a subsequent analog reference signal having the target reference clock frequency $Nf_{REF}$ includes multiplying an oscillator frequency of an oscillator signal by N at the expiration of the second nonzero interval.

Example 18 includes the subject matter of example 15, including or omitting optional elements, wherein the digital reference signal is generated by a clock gating circuitry configured to receive a master clock signal and generate the digital reference signal having a reference clock frequency $f_{REF}$ by passing every $x^{th}$ pulse of the master clock signal and generating a subsequent digital reference clock signal having the target reference clock frequency $Nf_{REF}$ includes controlling the clock gating circuitry to generate the digital reference clock signal by passing every $x/N^{th}$ pulse of the master clock signal at the expiration of the third nonzero interval.

Example 19 includes the subject matter of example 15, including or omitting optional elements, further including receiving a second target time occurring subsequent to the target time; at expiration of a first nonzero interval after the second target time, generating a subsequent feedback signal having a reference clock frequency $f_{REF}$; at expiration of a second nonzero interval after the second target time, generating a subsequent analog reference signal having the reference clock frequency $f_{REF}$; and at expiration of a third nonzero interval after the second target time, generating a subsequent digital reference clock signal having the reference clock frequency $f_{REF}$.

Example 20 includes the subject matter of example 15, including or omitting optional elements, further including determining the target time based on an operating condition of a transceiver that includes the DPLL.

Example 21 is a reference clock frequency shifting system for a digital phase locked loop (DPLL) including a digitally controlled oscillator (DCO) and a feedback loop, wherein the DPLL generates a local oscillator signal based on an analog reference signal having a reference clock frequency $f_{REF}$. The system includes trigger circuitry configured to determine a target time based on an operating condition of a transceiver that includes the DPLL and control circuitry. The control circuitry is configured to receive the target time from the trigger circuitry and, in response, at expiration of a first nonzero interval after the target time, cause the system to generate a subsequent feedback signal having the target reference clock frequency $Nf_{REF}$; at expiration of a second nonzero interval after the target time, cause the system to generate a subsequent analog reference signal having the target reference clock frequency $Nf_{REF}$; and at expiration of a third nonzero interval after the target time, cause the system to generate a subsequent digital reference clock signal having the target reference clock frequency $Nf_{REF}$.

Example 22 includes the subject matter of example 21 including or omitting optional elements, wherein the trigger circuitry is configured to determine the target time as a time at which a modulation coding scheme is changed.

Example 23 includes the subject matter of example 21 including or omitting optional elements, wherein the trigger circuitry is configured to determine the target time as a time at which a digital frequency shift occurs.

Example 24 includes the subject matter of example 21 including or omitting optional elements, wherein the trigger circuitry is configured to determine the target time as a time at which a transmit chain or receive chain in the transceiver that uses the local oscillator signal wakes from sleep mode.

Example 25 includes the subject matter of example 21 including or omitting optional elements, wherein the trigger circuitry is configured to determine a second target time based on the operating condition and provide the second target time and a second target reference clock frequency to the control circuitry.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A reference clock frequency shifting circuitry for a digital phase locked loop (DPLL) including a digitally controlled oscillator (DCO) and a feedback loop, wherein the DPLL generates a local oscillator signal based on an analog reference signal having a reference clock frequency $f_{REF}$, the circuitry comprising:
   a multiplier circuitry configured to generate the analog reference signal having the reference clock frequency $f_{REF}$;
   a digital clock circuitry configured to generate a digital reference clock signal having the reference clock frequency $f_{REF}$;
   a scaling circuitry configured to control the feedback loop to generate a feedback signal having the reference clock frequency $f_{REF}$; and
   control circuitry configured to identify a target reference clock frequency $Nf_{REF}$ and receive a target time, and in response:
   at expiration of a first nonzero interval after the target time, control the scaling circuitry to control the feedback loop to generate a subsequent feedback signal having the target reference clock frequency $Nf_{REF}$, where N is a positive number;
   at expiration of a second nonzero interval after the target time, control the multiplier circuitry to generate a subsequent analog reference signal having the target reference clock frequency $Nf_{REF}$; and
   at expiration of a third nonzero interval after the target time, control the digital clock circuitry to generate a subsequent digital reference clock signal having the target reference clock frequency $Nf_{REF}$.

2. The reference clock frequency shifting circuitry of claim 1, wherein:
   the scaling circuitry is configured to scale a channel word that controls a divider circuitry in the feedback loop to divide a signal output of the DCO by a divisor d to generate the feedback signal; and
   the control circuitry is configured to control the scaling circuitry to scale the channel word for the divider circuitry to divide the signal output of the DCO by d/N at the expiration of the first nonzero interval.

3. The reference clock frequency shifting circuitry of claim 2, wherein the scaling circuitry comprises:
   a multiplexor;
   a first channel word path connected to a first input of the multiplexor; and a second channel word path connected to a second input of the multiplexor, wherein the second channel word path includes a divider that divides an input channel word by N to generate a scaled channel word, and wherein the control circuitry is configured to control the multiplexor to output the scaled channel word at the expiration of the first nonzero interval.

4. The reference clock frequency shifting circuitry of claim 1, wherein:

the multiplier circuitry is configured to receive an oscillator signal having an oscillator frequency and generate the analog reference signal based on the oscillator signal; and the control circuitry is configured to control the multiplier circuitry to multiply the oscillator frequency by N at the expiration of the second nonzero interval.

5. The reference clock frequency shifting circuitry of claim 4, wherein the multiplier circuitry comprises:

a multiplexor;

a first oscillator signal path connected to a first input of the multiplexor; and a second oscillator signal path connected to a second input of the, wherein the second oscillator signal path includes a multiplication circuitry that multiplies the oscillator frequency by N to generate a multiplied oscillator signal, and wherein the control circuitry is configured to:
at the expiration of the second nonzero interval, enable the multiplication circuitry; and
after a predetermined interval after the expiration of the second nonzero interval, control the multiplexor to output the multiplied oscillator signal.

6. The reference clock frequency shifting circuitry of claim 5, wherein the first oscillator signal path includes a plurality of buffers configured to delay the oscillator signal in an equivalent manner as compared to delay of the oscillator signal caused by the multiplication circuitry.

7. The reference clock frequency shifting circuitry of claim 1, wherein:

the digital clock circuitry comprises a clock gating circuitry configured to receive a master clock signal and generate the digital reference clock signal having a reference clock frequency $f_{REF}$ by passing every $x^{th}$ pulse of the master clock signal; and the control circuitry is configured to control the clock gating circuitry to generate the digital reference clock signal by passing every x/Nth pulse of the master clock signal at the expiration of the third nonzero interval.

8. The reference clock frequency shifting circuitry of claim 1, wherein the control circuitry is configured to receive a second target time occurring subsequent to the target time and, in response:

at expiration of the first nonzero interval after the second target time, control the scaling circuitry to control the feedback loop to generate a subsequent feedback signal having the reference clock frequency $f_{REF}$;

at expiration of the second nonzero interval after the second target time, control the multiplier circuitry to generate a subsequent analog reference signal having the reference clock frequency $f_{REF}$; and at expiration of the third nonzero interval after the second target time, control the digital clock circuitry to generate a subsequent digital reference clock signal having the reference clock frequency $f_{REF}$.

9. The reference clock frequency shifting circuitry of claim 1, wherein the DPLL includes a digital loop filter that has a gain of G, the reference clock frequency shifting circuitry comprising:

gain circuitry configured to control the gain of the digital loop filter, and wherein the control circuitry is configured to control the gain circuitry to adjust the gain of the digital loop filter to have a gain of G/N at the expiration of a fourth nonzero interval after the target time.

10. The reference clock frequency shifting circuitry of claim 1, further comprising trigger circuitry configured to determine the target time based on an operating condition of a transceiver that includes the DPLL.

11. The reference clock frequency shifting circuitry of claim 10, wherein the trigger circuitry is configured to determine the target time as a time at which a modulation coding scheme is changed.

12. The reference clock frequency shifting circuitry of claim 10, wherein the trigger circuitry is configured to determine the target time as a time at which a digital frequency shift occurs.

13. The reference clock frequency shifting circuitry of claim 10, wherein the trigger circuitry is configured to determine the target time as a time at which a transmit chain or receive chain in the transceiver that uses the local oscillator signal wakes from sleep mode.

14. The reference clock frequency shifting circuitry of claim 10, wherein the trigger circuitry is configured to determine a second target time based on the operating condition and provide the second target time and a second target reference clock frequency to the control circuitry.

15. A method for shifting a reference clock frequency from $f_{REF}$ to a target reference clock frequency $Nf_{REF}$ for a digital phase locked loop (DPLL) comprising a digitally controlled oscillator (DCO) and a feedback loop that generates a feedback signal, wherein the DPLL generates a local oscillator signal based on an analog reference signal having a reference clock frequency $f_{REF}$ and a digital reference signal having the reference clock frequency $f_{REF}$, the method comprising:

receiving a target time;

at expiration of a first nonzero interval after the target time, generating a subsequent feedback signal having the target reference clock frequency $Nf_{REF}$, where N is a positive number;

at expiration of a second nonzero interval after the target time, generating a subsequent analog reference signal having the target reference clock frequency $Nf_{REF}$; and at expiration of a third nonzero interval after the target time, generating a subsequent digital reference clock signal having the target reference clock frequency $Nf_{REF}$.

16. The method of claim 15, wherein:

the feedback signal is generated by a divider circuitry in the feedback loop, wherein the divider circuitry divides a signal output of the DCO by a divisor d as controlled by a channel word received by the divider circuitry; and generating the subsequent feedback signal comprises scaling the channel word for the divider circuitry to divide the signal output of the DCO by d/N at the expiration of the first nonzero interval.

17. The method of claim 15, wherein generating a subsequent analog reference signal having the target reference clock frequency $Nf_{REF}$ comprises multiplying an oscillator frequency of an oscillator signal by N at the expiration of the second nonzero interval.

18. The method of claim 15, wherein:
the digital reference signal is generated by a clock gating circuitry configured to receive a master clock signal and generate the digital reference signal having a reference clock frequency $f_{REF}$ by passing every $x^{th}$ pulse of the master clock signal; and
generating a subsequent digital reference clock signal having the target reference clock frequency $Nf_{REF}$ comprises controlling the clock gating circuitry to generate the subsequent digital reference clock signal by passing every x/Nth pulse of the master clock signal at the expiration of the third nonzero interval.

19. The method of of claim 15, further comprising:
receiving a second target time occurring subsequent to the target time;
at expiration of a first nonzero interval after the second target time, generating a subsequent feedback signal having a reference clock frequency $f_{REF}$;
at expiration of a second nonzero interval after the second target time, generating a subsequent analog reference signal having the reference clock frequency $f_{REF}$; and
at expiration of a third nonzero interval after the second target time, generating a subsequent digital reference clock signal having the reference clock frequency $f_{REF}$.

20. The method of claim 15, further comprising determining the target time based on an operating condition of a transceiver that includes the DPLL.

21. A reference clock frequency shifting system for a digital phase locked loop (DPLL) comprising a digitally controlled oscillator (DCO) and a feedback loop, wherein the DPLL generates a local oscillator signal based on an analog reference signal having a reference clock frequency $f_{REF}$, the system comprising:
trigger circuitry configured to determine a target time based on an operating condition of a transceiver that includes the DPLL; and
control circuitry configured to receive the target time from the trigger circuitry and, in response:
at expiration of a first nonzero interval after the target time, cause the system to generate a subsequent feedback signal having a target reference clock frequency $Nf_{REF}$, where N is a positive number;
at expiration of a second nonzero interval after the target time, cause the system to generate a subsequent analog reference signal having the target reference clock frequency $Nf_{REF}$; and
at expiration of a third nonzero interval after the target time, cause the system to generate a subsequent digital reference clock signal having the target reference clock frequency $Nf_{REF}$.

22. The reference clock frequency shifting system of claim 21, wherein the trigger circuitry is configured to determine the target time as a time at which a modulation coding scheme is changed.

23. The reference clock frequency shifting system of claim 21, wherein the trigger circuitry is configured to determine the target time as a time at which a digital frequency shift occurs.

24. The reference clock frequency shifting system of claim 21, wherein the trigger circuitry is configured to determine the target time as a time at which a transmit chain or receive chain in the transceiver that uses the local oscillator signal wakes from sleep mode.

25. The reference clock frequency shifting system of claim 21, wherein the trigger circuitry is configured to determine a second target time based on the operating condition and provide the second target time and a second target reference clock frequency to the control circuitry.

* * * * *